United States Patent
Faraci et al.

(10) Patent No.: US 10,638,615 B2
(45) Date of Patent: Apr. 28, 2020

(54) SYSTEM AND METHOD FOR MANUFACTURING FLEXIBLE LAMINATED CIRCUIT BOARDS

(71) Applicant: Duetto Integrated Systems, Inc., Islandia, NY (US)

(72) Inventors: Anthony Faraci, Commack, NY (US); Gary N. Sortino, Baldwin, NY (US)

(73) Assignee: DUETTO INTEGRATED SYSTEMS, INC., Islandia, NY (US)

( * ) Notice: Subject to any disclaimer, the term of this patent is extended or adjusted under 35 U.S.C. 154(b) by 1181 days.

(21) Appl. No.: 14/825,462

(22) Filed: Aug. 13, 2015

(65) Prior Publication Data

US 2016/0014909 A1    Jan. 14, 2016

Related U.S. Application Data

(63) Continuation of application No. PCT/US2014/016983, filed on Feb. 18, 2014, and a continuation-in-part of application No. 14/341,901, filed on Jul. 28, 2014, now Pat. No. 9,282,651, which is a continuation of application No. 14/047,183, filed (Continued)

(51) Int. Cl.
  *B23K 37/00* (2006.01)
  *H05K 3/46* (2006.01)
  (Continued)

(52) U.S. Cl.
  CPC .......... *H05K 3/4638* (2013.01); *B23K 37/04* (2013.01); *H05K 3/00* (2013.01); *H05K 3/4691* (2013.01);
  (Continued)

(58) Field of Classification Search
  CPC ...... H05K 3/4638; H05K 3/4691; H05K 3/00; H05K 2203/06; H05K 2203/107;
  (Continued)

(56) References Cited

U.S. PATENT DOCUMENTS 5,048,178 A       9/1991  Bindra
5,970,310 A  *  10/1999  Satoh .................. G03F 7/70425
                                                    438/128

(Continued)

FOREIGN PATENT DOCUMENTS

JP          3708133 B2 * 10/2005  ........... H05K 3/4638
JP          2008-311553      12/2008
(Continued)

OTHER PUBLICATIONS

English abstract of KR 20080020730A (Mar. 2008).*

(Continued)

*Primary Examiner* — Kiley S Stoner
(74) *Attorney, Agent, or Firm* — Andrew F. Young, Esq.; Lackenbach Siegel, LLP

(57) ABSTRACT

The present invention relates to an improved system and method for manufacturing flexible circuit boards (FSBs) using optical alignment and various bonding systems. The invention provides an improved process to connect together the layers of rigid-flex, flexible, and printed circuit boards while maintaining alignment of the layers prior to and possibly after a lamination step. An optical alignment system is provided, a preferred arrangement is enabled as an automated pinless bonding system (PBS), for securely gripping, aligning, transferring, and clamping, bonding and moving a bonded FSB employing a multi-axis orientation. An alternative manual optical alignment and bonding system is provided.

4 Claims, 17 Drawing Sheets

Related U.S. Application Data on Oct. 7, 2013, now Pat. No. 8,931,918, which is a continuation of application No. 13/247,574, filed on Sep. 28, 2011, now Pat. No. 8,594,983, which is a continuation of application No. 12/208,972, filed on Sep. 11, 2008, now Pat. No. 8,065,121, which is a continuation of application No. PCT/US2007/064435, filed on Mar. 20, 2007, application No. 14/825,462, filed on Aug. 13, 2015, which is a continuation-in-part of application No. 12/377,268, filed as application No. PCT/US2007/077178 on Aug. 30, 2007, now abandoned.

(60) Provisional application No. 61/765,727, filed on Feb. 16, 2013, provisional application No. 61/802,650, filed on Mar. 16, 2013, provisional application No. 60/783,888, filed on Mar. 20, 2006, provisional application No. 60/824,263, filed on Aug. 31, 2006.

(51) Int. Cl.
*B23K 37/04* (2006.01)
*H05K 3/00* (2006.01)
*H05K 1/02* (2006.01)

(52) U.S. Cl.
CPC . *H05K 1/0269* (2013.01); *H05K 2201/09918* (2013.01); *H05K 2203/06* (2013.01); *H05K 2203/065* (2013.01); *H05K 2203/101* (2013.01); *H05K 2203/107* (2013.01); *H05K 2203/1476* (2013.01); *H05K 2203/166* (2013.01); *Y10T 29/49126* (2015.01); *Y10T 29/49213* (2015.01); *Y10T 29/5317* (2015.01); *Y10T 29/53087* (2015.01)

(58) Field of Classification Search
CPC ... H05K 2203/166; H05K 2201/09918; H05K 1/0269; H05K 2203/065; H05K 2203/1476; H05K 2203/101; Y10T 29/49213; Y10T 29/49126; Y10T 29/5317; Y10T 29/53087; B23K 37/04–0461

USPC .. 228/102–103, 105, 8–12, 44.3, 44.7, 47.1, 228/49.1, 49.4, 49.5

See application file for complete search history.

(56) References Cited

U.S. PATENT DOCUMENTS

| | | | | |
|---|---|---|---|---|
| 6,000,124 | A | * 12/1999 | Saito | H05K 3/4638 156/64 |
| 6,232,559 | B1 | * 5/2001 | Janecek | H05K 3/4638 174/250 |
| 6,317,953 | B1 | * 11/2001 | Pryor | A01B 69/008 29/407.01 |
| 2002/0166885 | A1 | * 11/2002 | Sugawara | B23K 20/004 228/103 |
| 2005/0270518 | A1 | * 12/2005 | Sugawara | G03B 27/32 355/77 |
| 2008/0094465 | A1 | * 4/2008 | Okutsu | B41J 2/442 347/248 |
| 2009/0035669 | A1 | * 2/2009 | Uemura | G03F 7/70775 430/22 |
| 2009/0059297 | A1 | * 3/2009 | Uemura | G03F 9/7003 358/1.18 |
| 2012/0174387 | A1 | * 7/2012 | Faraci | H05K 3/4638 29/720 |

FOREIGN PATENT DOCUMENTS

| | | |
|---|---|---|
| JP | 4554381 | 9/2010 |
| KR | 10-0828309 | 5/2008 |
| KR | 10-0828312 | 5/2008 |

OTHER PUBLICATIONS

English abstract of KR 20080019898A (Mar. 2008).*
English abstract of JP 2006203061A (Mar. 2008).*
English abstract of JP 4554381 (no date available).*
PCT/US2014/016983 International Search Rerport dated May 26, 2014, 3 pages—English.

* cited by examiner

SYSTEM AND METHOD FOR MANUFACTURING FLEXIBLE LAMINATED CIRCUIT BOARDS

CROSS REFERENCE TO RELATED APPLICATION

This application relates to and is a § 1.53(b) continuation of Ser No. PCT/US2014/016983 filed Feb. 18, 2014 which claims priority from U.S. Prov. Ser. No. 61/765,727 filed Feb. 16, 2013, and U.S. Prov. Ser. No. 61/802,650 filed Mar. 16, 2013, the entire contents of each of which are incorporated herein by reference.

This application also relates to and claims priority as continuation-in-part from U.S. Ser. No. 14/3341,901 filed Jul. 28, 2014 which is a continuation of U.S. Ser. No. 14/047,183 filed Oct. 7, 2013 issued as U.S. Pat. No. 8,831,918 on Sep. 3, 2014 which in turn claims priority as a continuation from U.S. Pat. No. 8,594,983 issued Nov. 26, 2013, which in turns claims priority from U.S. Pat. No. 8,065,121 issued Nov. 22, 2011 which in turn claims priority as a national phase § 371 from PCT/US07/64435 filed Mar. 20, 2007 which claims priority from U.S. Prov. App. Ser. No. 60/783,888 filed Mar. 20, 2006, the entire contents of each of which are herein incorporated by reference.

This application also relates to and claims priority as continuation-in part from U.S. Ser. No. 12/377,268 filed Feb. 12, 2009, which in turns claims priority as a national phase § 371 from PCT/US2007/77178 filed Aug. 30, 2007 which claims priority from U.S. Prov. App. Ser. No. 60/824, 263 filed Aug. 31, 2006, the entire contents of each of which are incorporated herein by reference.

FIGURE SELECTED FOR PUBLICATION

FIG. 2

BACKGROUND OF THE INVENTION

Field of the Invention

The present invention relates to an improved system and method for manufacturing flexible laminated circuit boards. More particularly, the present invention provides an improved method for manufacturing flexible laminated printed circuit boards (PCBs) with manual and automated optical pinless and partial pinless bonded layup features that minimize alignment error in manufacturing.

Description of the Related Art

The related art involves a process for producing rigid printed electronic circuits, including multilayer circuits by endothermic induction heading as discussed in PCT/IT2003/000403 by Ceraso, et al., (published as WO 2004/103042) [the Ceraso system] the entire contents of which are herein incorporated by reference. During processing, a ferromagnetic core having an alternating current winding is positioned proximate the endothermic heating pile and induces an inductive field within the copper laminae to warm the heating pile (which includes resin sheets (also known commonly as "pre-preg")), and laminate the individual layers together. The solution created by this reference eliminates several of the detriments known in the related-art heating techniques for rapidly forming multilayer laminates, and has been widely adopted by the industry as a result. Unfortunately, the Ceraso process, while more rapid, fully fails to enhance accuracy and commonly incurs higher quality control loses that often costs more than the efficiency gained by the improvement in speed.

It is additionally recognized that multilayer rigid and flexible circuit boards (FSBs) can be manufactured by pin type registration systems to allow integration of a completed FSB into a complex geometry (e.g., a camera body). Typically, FSB's are joined by pins through conductive layers and (during layup) flexible portions project laterally from the plane of a rigid circuit board (in parallel thereto), such that the FSB portion (after processing) bends at an edge of a rigid circuit board. Examples of this construction are noted in Printed Circuits Handbook, $6^{th}$ Edition, by Clyde F. Coombs, Jr., Chapt. 65, pages 65.1-65.10, the entire contents of which are incorporated by reference.

Unfortunately, the two above-noted conventional constructions have concerns with inherent errors, misalignment, and inefficiencies, particularly when using pin-type-layup procedures.

Applicant's related inventions in U.S. Pat. No. 8,051,121 issued Nov. 22, 2011, entitled Improved System for Manufacturing Laminated Circuit Boards, provide further improvements using computerized processor linked optical systems for corrective alignment for perfected stack orientation, and further eliminates the need for pin-type layups, and much more including the mechanical-operative systems for the same. The entire contents of U.S. Pat. No. 8,051,121 are fully incorporated herein by reference. Applicants other related inventions for further optical accuracy include U.S. Pat. No. 8,594,983 issued Nov. 26, 2013 and is also incorporated by reference.

Applicant's further related inventions in U.S. Ser. No. 12/377,268, entitled Bond Head Assembly and System, provides further improvements for automated and aligned electromagnetic bonding of PCBs. The entire contents of U.S. Ser. No. 12/377,268 are fully incorporated herein by references.

It will be understood that Applicant's related inventions involve an optical alignment system with processor control and an automated bonding system capable of bonding regions of panel layups as discussed in the respective references.

In combination, Applicant's above-noted inventions provide an enabling support for operative and automated optical alignment systems for manufacturing and bonding laminated circuit boards.

Referring now to FIG. 1, a conventional rigid-flexible board pin lay-up process 200 is discussed. As shown, a plurality of both outboard (around the periphery, as shown) and inboard (interior, as shown in two sets of four each) pins are shown at 201. Conventionally, these pins 201 create a number of detriments as will be discussed below. Opposing top and bottom lamination plates 202A, 202B must be custom made for each particular PCB and FSB constructed, even for a single use, and must be stored between uses. There between opposing top and bottom copper foil layers 203A, 203B are provided being also custom punched to align with pins 201. There between are also a prepreg bonding sheets 204A, 204B, rigid boards 205A, 205B, and film coverlays 207A, 207B. Interior of all of this is flexible circuit layer(s) 208. It will be understood that flex circuit layer 208 can include multiple flex circuit layers and is shown with a rigid outer portion. All arranged as shown in FIG. 1. The phrases prepreg, flex, and coverlay will be understood by those of skill in the conventional arts.

As a result, a conventional rigid-flex pin layup process 200, will at a minimum require the steps noted, including: (1) punching top and bottom lamination plates for all pin locations, (2) punching top and bottom foils at all pin locations, (3) punching top and bottom prepregs at all pin locations, (4) punching top and bottom rigid boards at all pin locations, (5) punching top and bottom film coverlays at all pin locations, and (6) punching the flex layer(s) which will require punching at all pin locations to enable all pins 201 to fully pass through the entire layup 200 for alignment. In this manner, the entire assembly 200 will be understood as a panel lay-up and includes the pins, lamination plates, and all components.

The conventional rigid-flex pin layup process 200 creates a number of detriments, well understood. These include, but are not limited to; (1) all holes must be punched or drilled on all materials individually without error, and this requires additional time as every layer must be punched or drilled accurately. Thus alignment of all hole-preparation is extremely critical on flex and rigid layer and results in substantial losses to quality control pre- and post-manufacturing.

Additionally, (2) lamination fixtures must be custom made, each specific to a particular job-circuit, and this requires that manufacturers both generate and then retain/store multiple custom lamination fixtures. Further, (3) When processing with outer layer foils, all holes must be placed prior to final lay ups—this requires additional time. Fourth (4) All prepreg layers must have additional clearance holes prepared for lamination pins prior to final lay-up. Fifth (5) All cover layers must have clearance holes or material cut-away from pining areas requiring additional planning, operations, and waste of time and materials. Sixth, (6) after a lamination cycle for a FSB, all pins must be manually knocked-out of the lamination book (the assembly itself) post interior-bonding in order to breakdown and remove the laminated rigid-flex board desired.

In summary, the current "state of the art" process requires pins placed near design features to locate the layers during the FSB assembly process (See FIG. 1). These pins also are used to minimize and control the movement of the various layers during the lamination press cycle where all the layers are laminated into a single structural unit. While this FSB process has been in use for many years and the use, particularly for rigid flex constructions is wide spread, it does have significant drawbacks that this invention addresses. These detriments include the existing process must be done by hand. It is not easily automated and has not been automated. The process is laborious and thus expensive. Each pin location must have a hole drilled, punched or lased (hole made with a laser) in each layer of rigid material, flex material, cover material, prepreg (a sheet of epoxy resin in the dry or "B" stage), bond ply, copper foil, separator plates and lamination plates. This is a considerable undertaking to accurately place holes in all of this material and often there are errors requiring loss of an entire PCB. Because the pins are in contact with the prepreg epoxy resin, bonding materials and adhesives, the pins are difficult to remove and can damage a PCB (printed circuit board) in the process of trying to remove the pins. The pins must be cleaned, in order to be reused. The pins are subject to wear and must be replaced. Worn pins can lead to layer to layer inaccuracies. The Applicant's invention described below removes these drawbacks and enables a PCB manufacturer to create rigid flex, flex and rigid printed circuit boards more efficiently. This new process will also allow automation to be utilized, if desired, to further improve manufacturing efficiency and/or layer to layer accuracy.

Therefore, the conventional arts provide substantial operational, and thus financial, detriments. Accordingly, there is a need for an improved system and method for manufacturing flexible laminated circuit boards (FSBs). Further, there is also a need to provide improved process efficiency when manufacturing flexible circuit boards (FSBs) that may be adapted to an optical or pin type lay up process.

ASPECTS AND SUMMARY OF THE INVENTION

In response, it is now recognized that an optical alignment of FSB's and interior-region bonding (by inductive or thermal bonders) may be incorporated with a manual alignment system or optionally with an automated alignment and target system with improved efficiency.

The present invention relates to an improved system and method for manufacturing flexible circuit boards (FSBs) using optical alignment and various bonding systems. An optical alignment system is provided, a preferred arrangement is enabled as an automated pinless bonding system (PBS), for securely gripping, aligning, transferring, and clamping, bonding and moving a bonded FSB employing a multi-axis orientation. An alternative manual optical alignment and bonding system is provided.

An aspect of the present invention provides a registration system for bonding a panel layup of a plurality laminate elements in a selected stack orientation, the system comprising: first optical measurement means for receiving the layup, for imaging portions of the layup, and for determining a first reference orientation data set of the layup relative to a desired orientation of the layup, computer operation control system means for determining a required correction factor between the determined first reference orientation data set for the layup and the desired orientation of the layup, and pin-less alignment and positioning means for receiving the required correction factor positioning instructions from the computer operation control system and for positioning each the layup from a top position to the desired orientation during a bonding of the layup.

According to another aspect of the present invention, there is provided a registration system, further comprising: means for inductively bonding at least a first layup in the desired orientation.

According to another aspect of the present invention, there is provided a registration system, wherein: the pin-less alignment and positioning means positions each the layup according to a four-axis orientation.

According to another aspect of the present invention, there is provided a registration system, wherein: the pin-less alignment and positioning means includes a pre-alignment loading station, a plurality of imagery cameras on the pre-alignment loading station, the plurality of imagery cameras enabling a pre-alignment of a layup, a gripper assembly employs at least a vacuum plate system, a cam adjustment system movable relative to the vacuum plate system for adjustment, and a motion sensor system for gripping and positioning each the layup in the desired orientation, whereby the registration system enables rapid alignment and bonding operational use. This is additionally supported by the disclosure, incorporated by reference, to applicants U.S. Pat. No. 8,065,121.

According to another aspect of the present invention, there is provided a method for pin-less bonding of a panel layup in a desired orientation, comprising the steps of: providing a first optical measurement means for receiving the layup, imaging portions of the layup and identifying at least two imaging targets for alignment, determining a first reference orientation data set for each layup, providing computer operation control system means for determining a required correction factor between a determined first reference orientation data set for each layup and the desired orientation during a use of the method, providing a pin-less alignment means for receiving the required correction factor positioning as a movement instruction from the computer operation control system, positioning each the layup from a top position to the desired orientation based upon the required correction factor and clamping the same in a bonding position, and bonding at least one portion of the layup.

The above and other aspects, features and advantages of the present invention will become apparent from the following description read in conjunction with the accompanying drawings, in which like reference numerals designate the same elements.

BRIEF DESCRIPTION OF THE DRAWINGS

FIG. 9E notes an arrangement in a pined position.

DETAILED DESCRIPTION OF THE PREFERRED EMBODIMENTS

Figure 1:
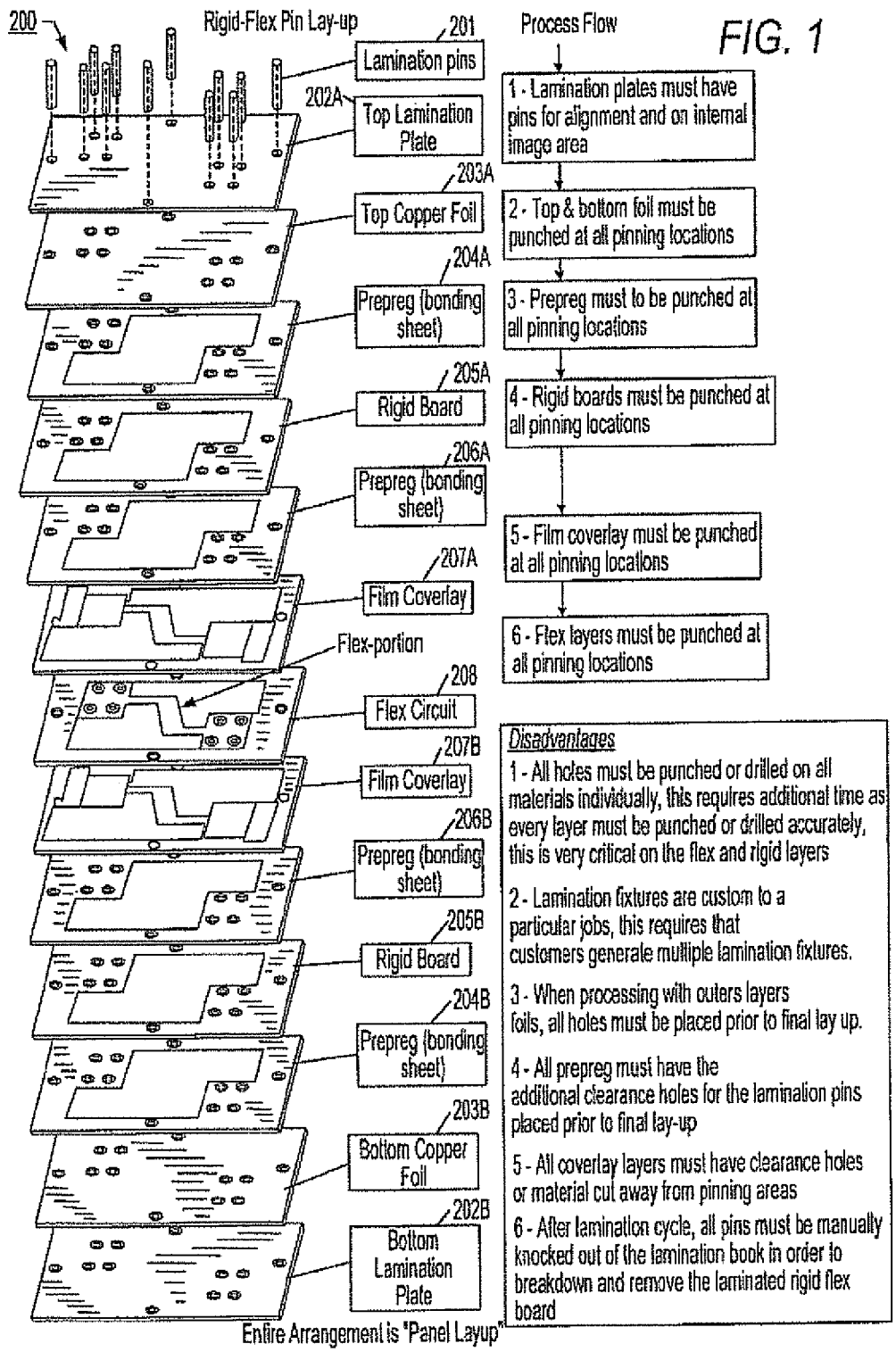
FIG. 1 is an illustrative schematic of a convention rigid flex pin layup system, noting a flex-circuit.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

One of the present inventions is a device for optically aligning and positioning a rigid-flex panel layup. Another aspect of the present invention, is provided by incorporation by reference wherein automated alignment processors may align optically (via location of an optical target sensing and auto-correcting for suitable alignment), and for automated interior and perimeter bonding using an X-Y-Y process for alignment.

It will also be understood, that as used herein the bond, weld, secure, or fuse will be recognized as representing the process of fusing either a FSB or other circuit board together in multiple layers as recognized in the art, such that the phrase bond/weld does not prevent thermal heater cartridges being understood as a substitute for induction bonding heads. It will be understood that for bonding, any suitable temperature is employed, and this is understood to be generally less than 340° C., and more typically in the range of 240° C.+/−20° C., but without limitation thereto.

Figure 2:
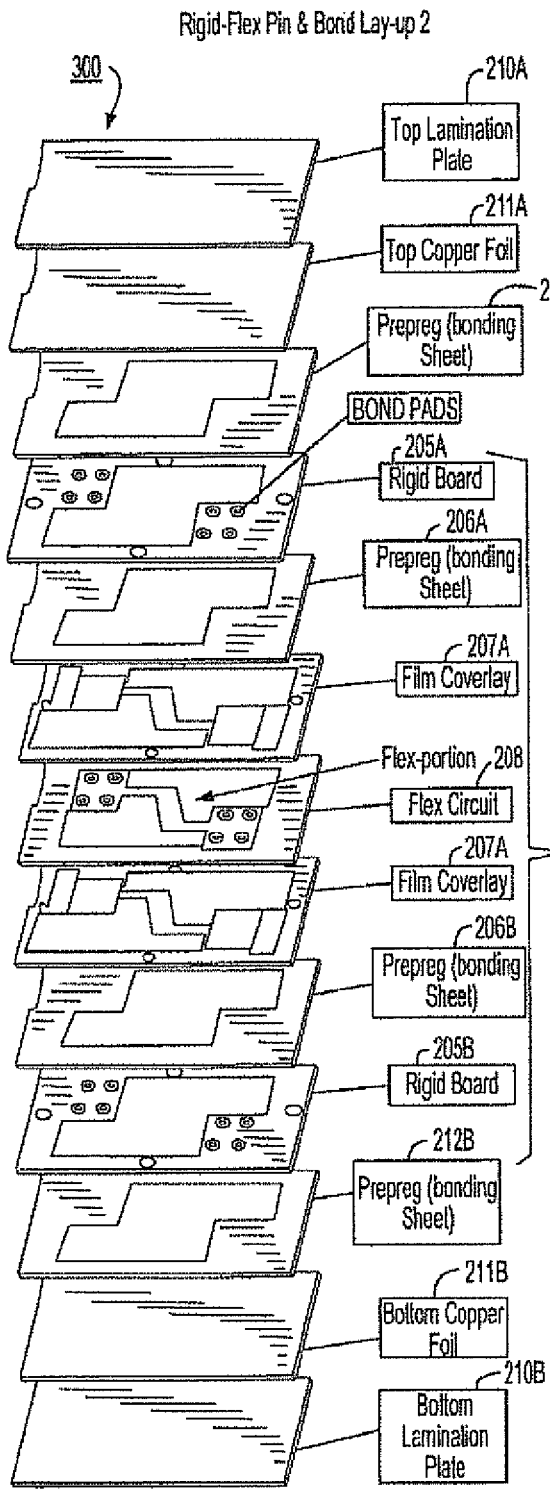
FIG. 2 is an illustrative schematic of a rigid flex pin bond layup.
Figure 2:
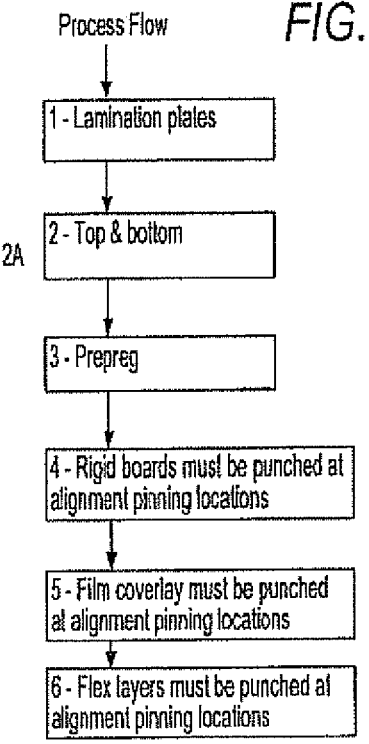

Referring now to FIG. 2, a rigid-flexible board optical-pin lay-up process 300 is discussed. As shown, no pins are provided at this initial stage, either around the periphery or on an interior. Non-specialized (allowing alternative use) opposing top and bottom lamination plates 210A, 210B useful for common PCB and FSB constructions. There between are opposing top and bottom copper foil layers 211A, 211B are provided also being without punched holes. There between are also a prepreg bonding sheets 212A, 212B, also without punched holes, and thereafter, rigid boards 205A, 205B, and film coverlays 207A, 207B. Interior of all of this is flexible circuit layer(s) 208. It will be understood that flex circuit layer 208 can include multiple flex circuit layers. All arranged as shown in FIG. 2. The phrases prepreg, flex, and coverlay will be understood by those of skill in the conventional arts.

As a result, a rigid-flex layup process 300 (without initial pins), will at a minimum require the steps noted, including: (1) providing top and bottom lamination plates without pin locations, (2) providing top and bottom copper foil and prepreg layers, (3) punching top and bottom rigid boards at select pin locations, (4) punching top and bottom film coverlays at pin locations, and (5) punching the flex layer(s) which will require punching at all pin locations to enable pins (to be noted later) to fully pass through the selected layup for alignment during interior bonding. In this manner, the entire assembly 300 will be understood as a partial panel lay-up but without initial pining. The layers are pined on alignment tooling holes then bonded on all internal bond pads on an optical aligning bonding system (noted later) for all components thereby greatly eliminating the concerns noted earlier.

The proposed detriments and benefits are noted. As a detriment, there are still alignment holes needed, but the number is greatly reduced (to a minimum of two), and thus each sheet in the layup requires the minimum pin-alignment holes to be punched or drilled accordingly, again in a very critical alignment process. Further, as a benefit with system 300, lamination fixtures are not custom made to a particular job, and can be used for a variety of initial circuit layouts. Typically the size may be 18" by 24", but there is no limitation to the present system. As an ongoing requirement all coverlay layers must have clearance holes or material cut away from pining areas. The result is a substantial benefit in efficiency, cost reduction, and speed of operation.

Figure 3:
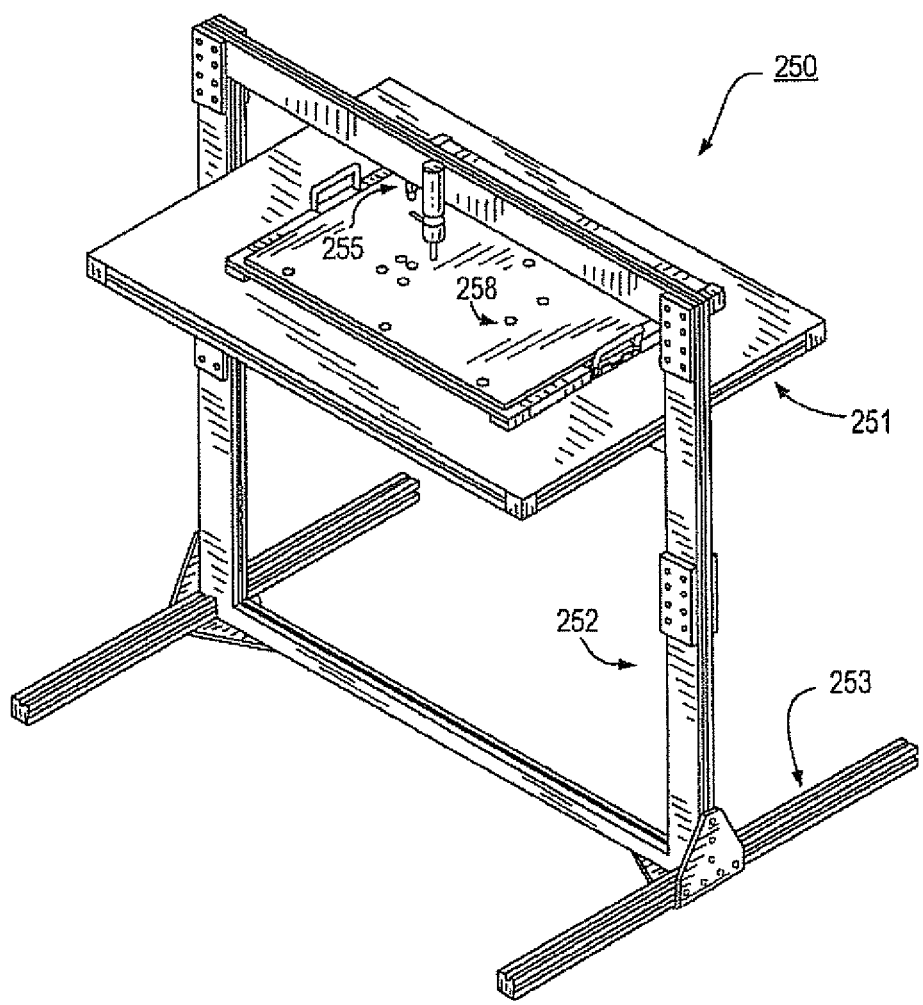
FIG. 3 is a perspective view of a rigid flex partial-pin and bond gantry device with optical alignment in a single station.
Figure 4:
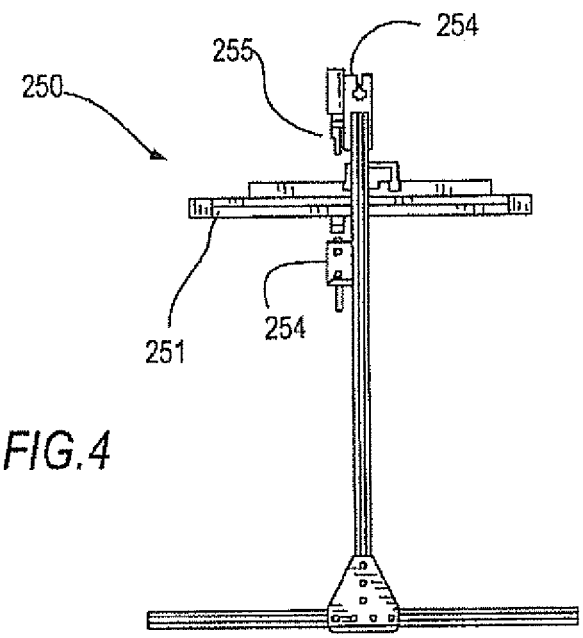
FIG. 4 is a side view of FIG. 4.
Figure 5:
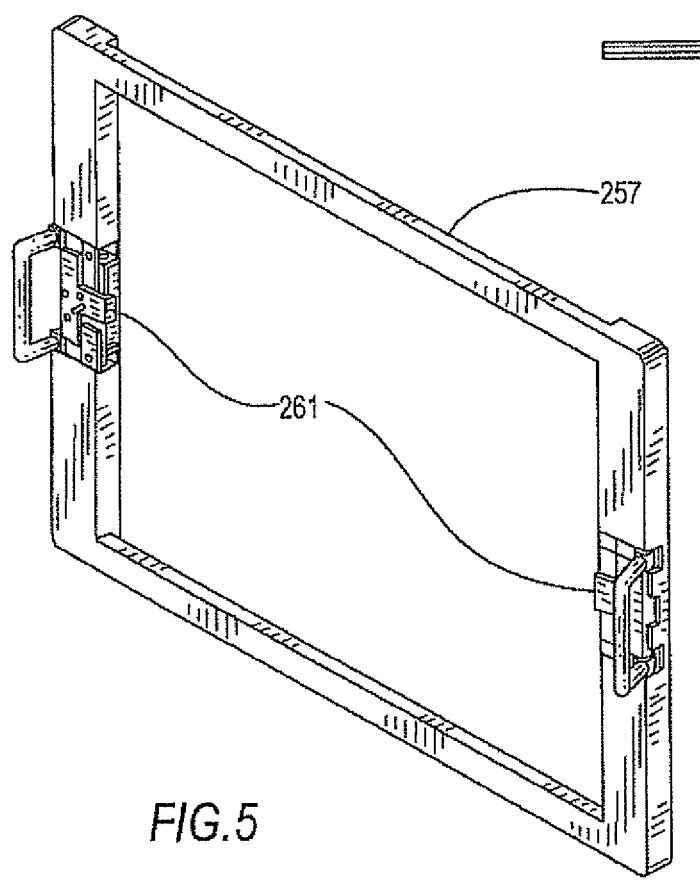
FIG. 5 is a perspective view of a generic layup template used with the rigid flex partial pin and bond device in FIG. 3 with rotating handles and pins for holding an arranged and built layup.

Referring now to FIGS. 3-5 and optically aligned bonding system 250 with outer pin alignment is provided. In this embodiment system 250 is provided as a manual gantry type system but other automated, computer controlled, and optically aligned systems (discussed later) may be provided without departing from the scope and spirit of the present invention.

System 250 includes a support platform 251 supported by supports 252 and legs 253, with an over support (shown as a gantry) for supporting respective bonding head members 254, 254. Here bonding heads may be induction bonding heads or thermal heads as discussed elsewhere herein. An optical alignment means 255 (here a laser pointer) is positioned on the top gantry proximate top bonding head 254 providing an offset laser alignment to denote respective interior bond sites 258 for bonding action. A rigid layup template 257 is shown positioned on platform 251 and in a sliding X-Y relationship therewith. During a use, an entire layup panel is positioned on and pined to lay up template 257 between respective handles, and optically aligned with optical alignment means 255, positioning the same on respective bond sites 258 wherein respective opposed bond head members 254, 254 operate (hydraulically, pneumatically, manually), to contact the layup panel and bond the respective bond site. Multiple bond head members may be used on either top or bottom sides.

Figure 6:
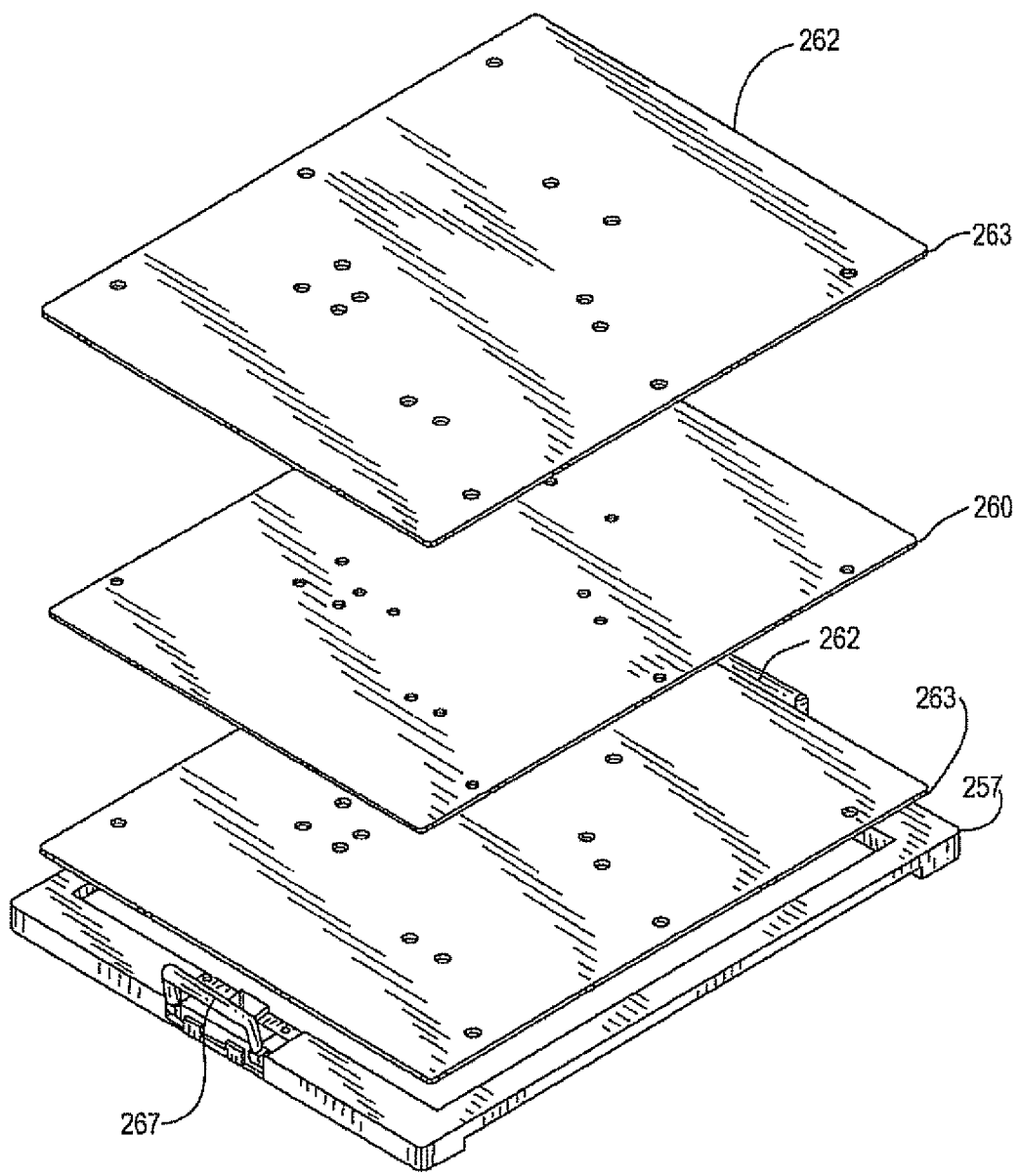
FIG. 6 is a perspective view of a layup template in FIG. 5 used with a panel lay up (shown as one piece) with top and bottom bond templates.
Figure 7:
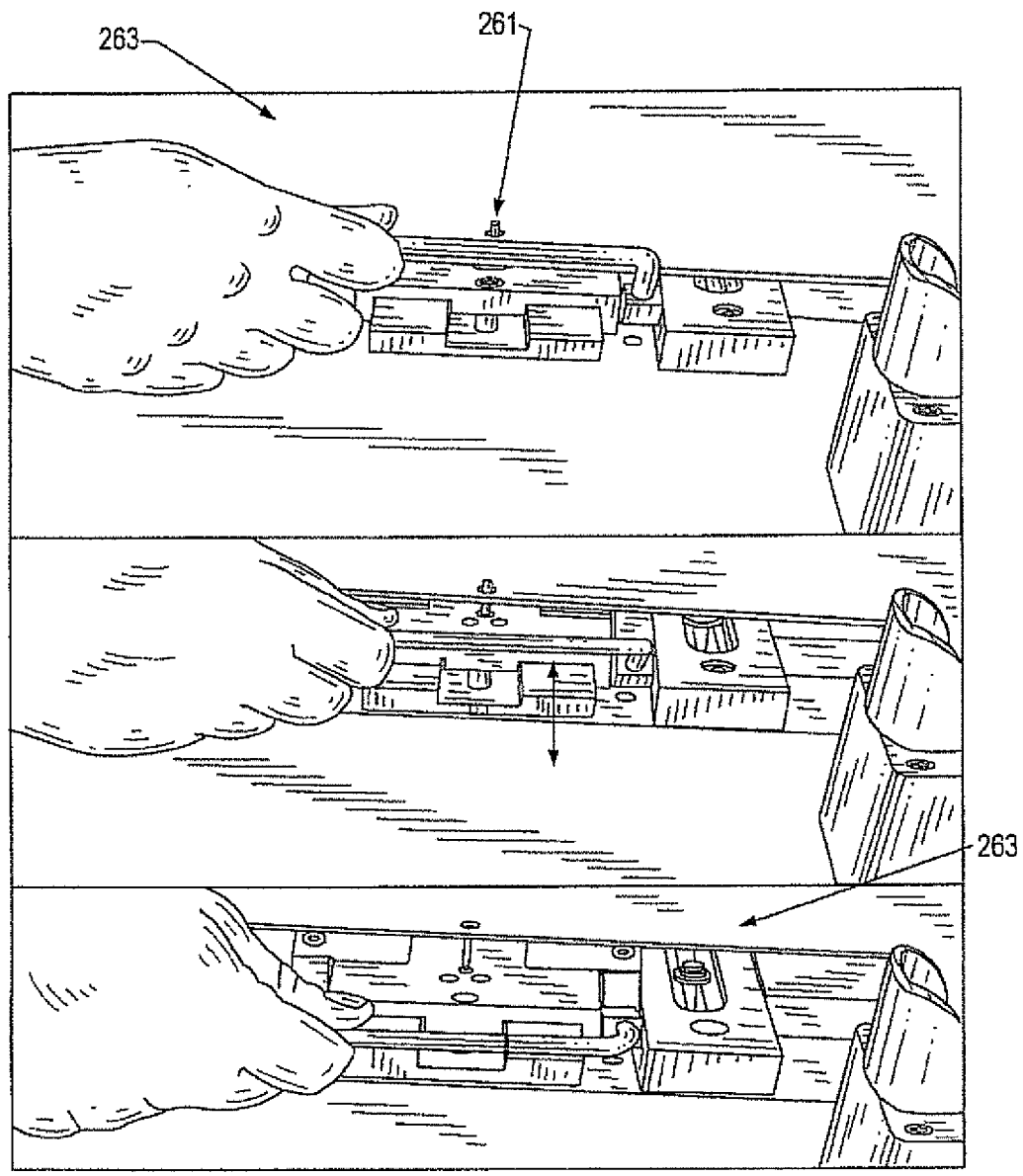
FIG. 7 is a pictographic illustration flow of removal of a pin block motion removing a bonded rigid flex panel.

Referring specifically now to FIGS. 6 and 7, lay up template 257 is noted with two handles, each having a respective pin 261 (only one shown in FIG. 6, two shown in FIG. 5). A bottom bond template 263 having respectively a plurality of bond site openings 258 and two pin openings 262 is layered with layup panel 260 and a top bond template 263, so as to be retained on layup template 257 aligned on pins 261 and held fixed by the construction of template 257 and slidably operable along platform 251 by respective handles. As noted a handle 267 is provided on either side of template 257 and is operable in a pivot motion (see arrow FIG. 7) to cause respective pins 261, 261 to raise and lower relative to template 257 edges and thereby disengage layup panel 260, and bond templates 263 for non-damaging removal from template 257. In this manner, a manual pin alignment but optically bonded and guided system 300 can be easily provided.

Figure 8:
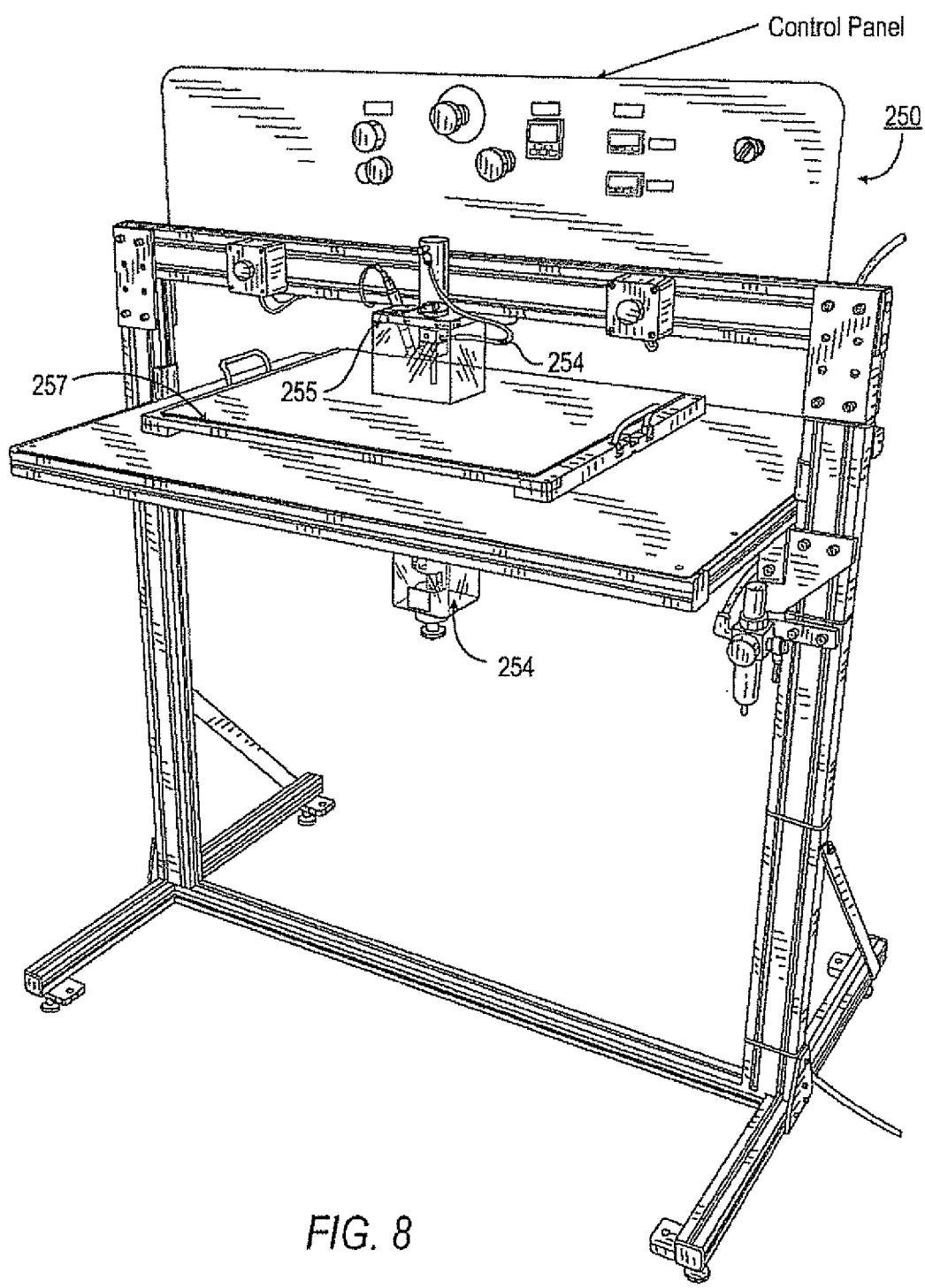
FIG. 8 is an image of a bond device with optical alignment in a single station as a manual flex bonding system.
Figure 9:
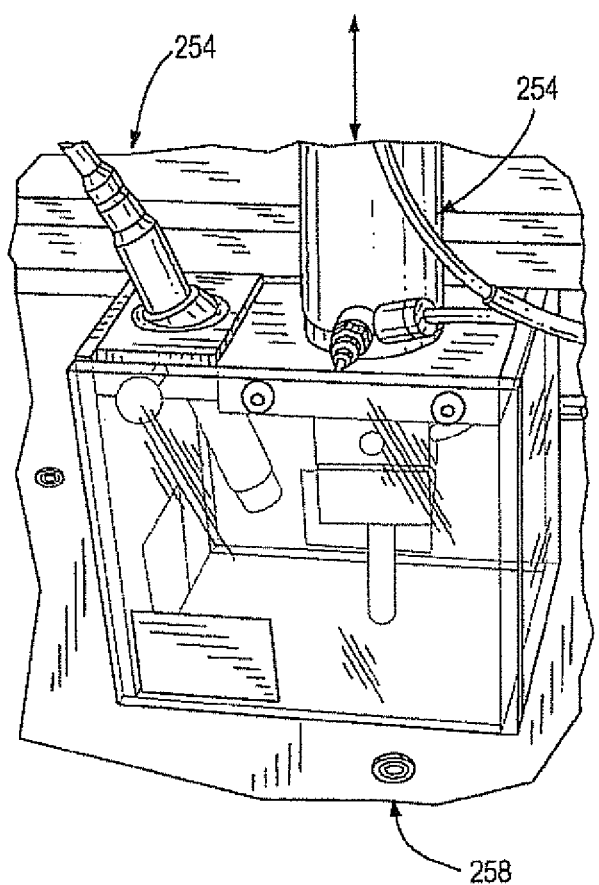
FIG. 9 is a close up image of one bonding head with optical target alignment.

Referring now to FIGS. 8 and 9 pictorial representations of system 250 are provided noting similar features including platform 251 relative to the support 252 and leg 253 members and a gantry member (as shown). Respective top and bottom bond heads 254, 254 are positioned co-axially on platform 251 and gantry for coaxial motion, here under pneumatic guidance along a motion axis to contact bond sites 258 designated by top and bottom bond templates 263 respectively. An optical aligning system 255, is noted here as a laser providing an guiding beam onto target 258 allowing a user to guide layup template 257 along platform 251 to position alignment laser beam on target 258 and to engage the respective operable instruments to bond each desired bond site.

As will be noted, but not numbered, various operational controls are provided on system 250, these include dual on/off buttons (directly on the gantry), a master off (centered on top panel), a pressure gauge (for regulating the contact pressure of the bonding heads, in this case thermal cartridges having a bond pressure (in the 2 Bar or 20-30 psi range), a time counter controller (for bonding time regulation), a temperature controller for each bond head (there are two shown) and a manual control for power on/off on the far right. A pressure-air filter is noted, and a power supply cord is shown.

Referring now to FIGS. 9A-9H and optically aligned bonding system 250A with outer pin alignment is provided. In this embodiment system 250A is provided a gantry type system with automation computer controlled capacity, and optically aligned systems, and may also be optionally used manually without departing from the scope and spirit of the present invention.

Figure 9A:
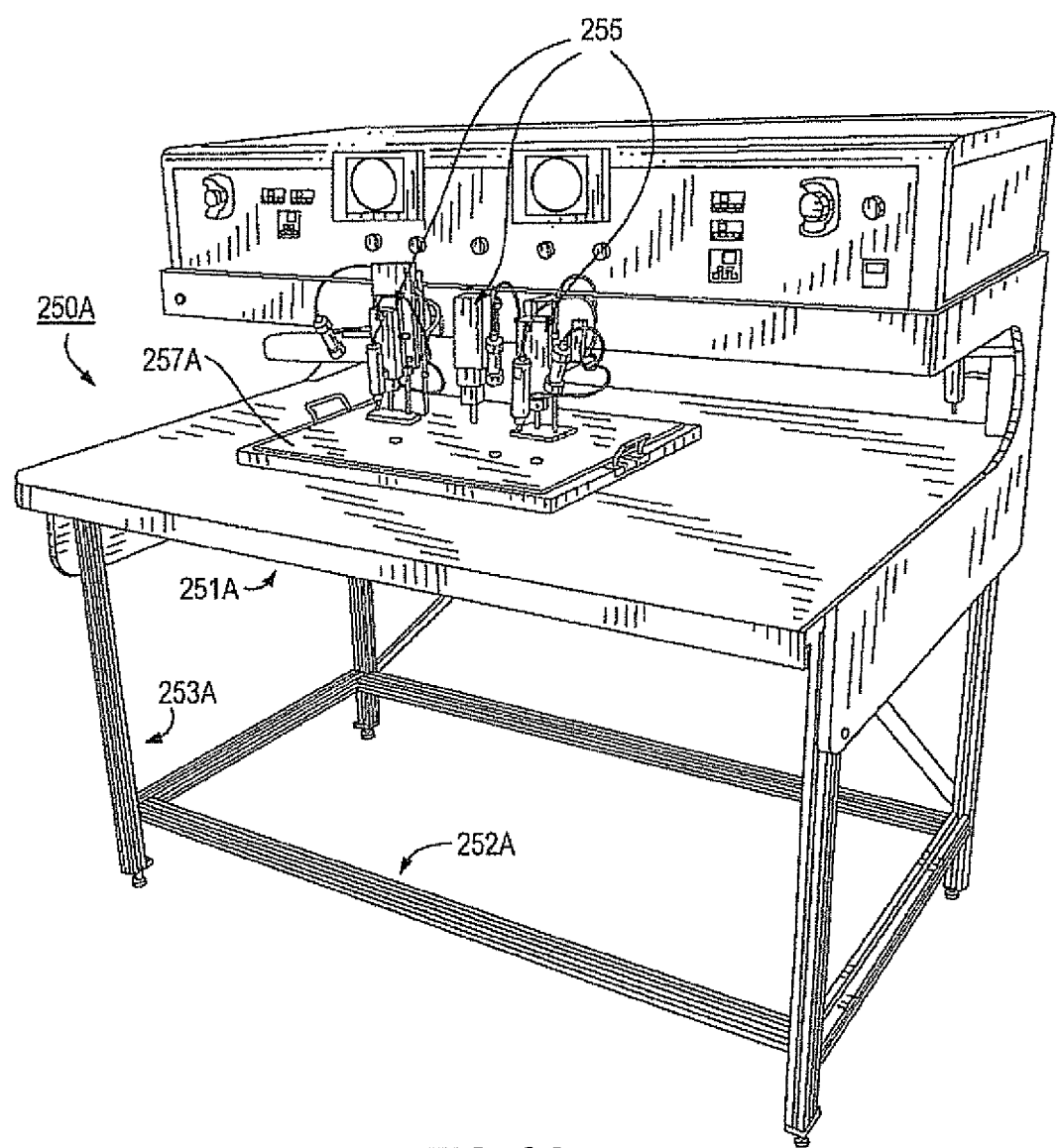
FIGS. 9A-9C is an alternative image of a bond device with optical alignment in a single station as a manual flex bonding system.
Figure 9B:
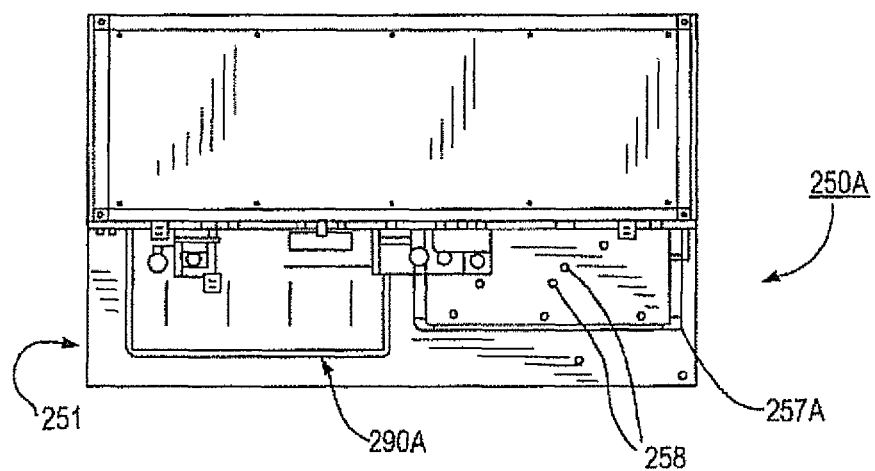
Figure 9C:
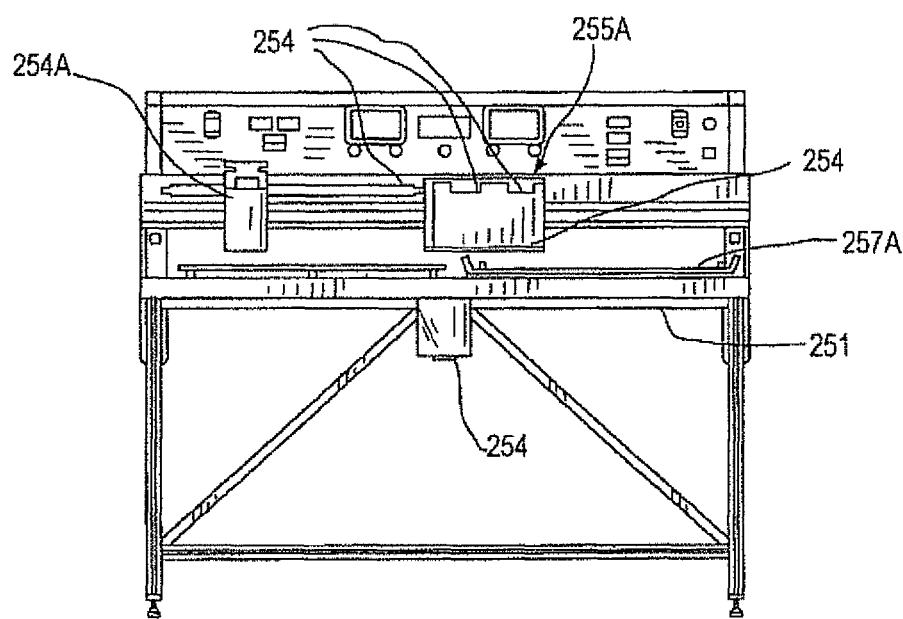
Figure 9D:
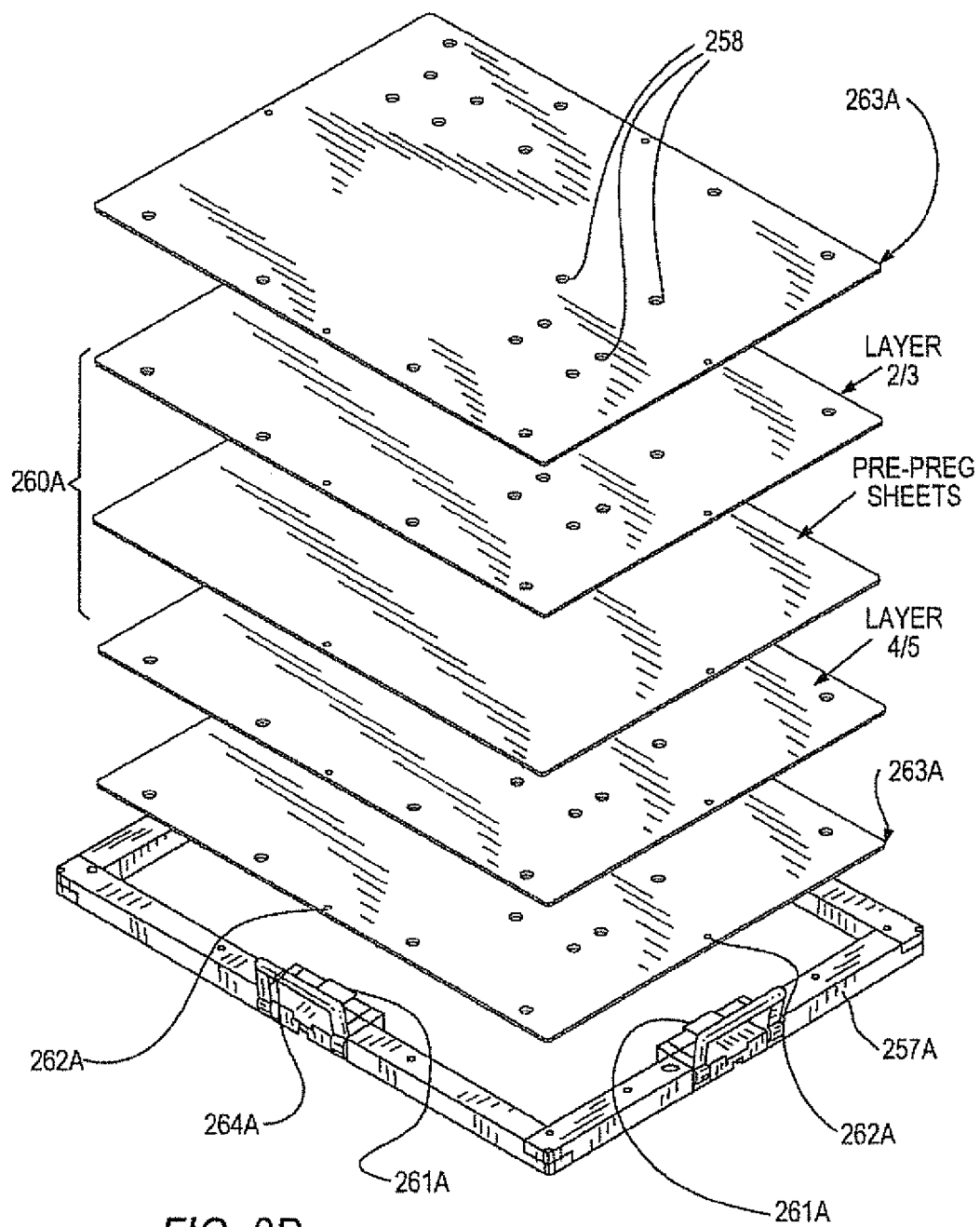
FIG. 9D is a different perspective view of a layup template like that shown in FIG. 5 or 6 as one panel lay up (shown as one piece) with top and bottom bond templates.
Figure 9E:
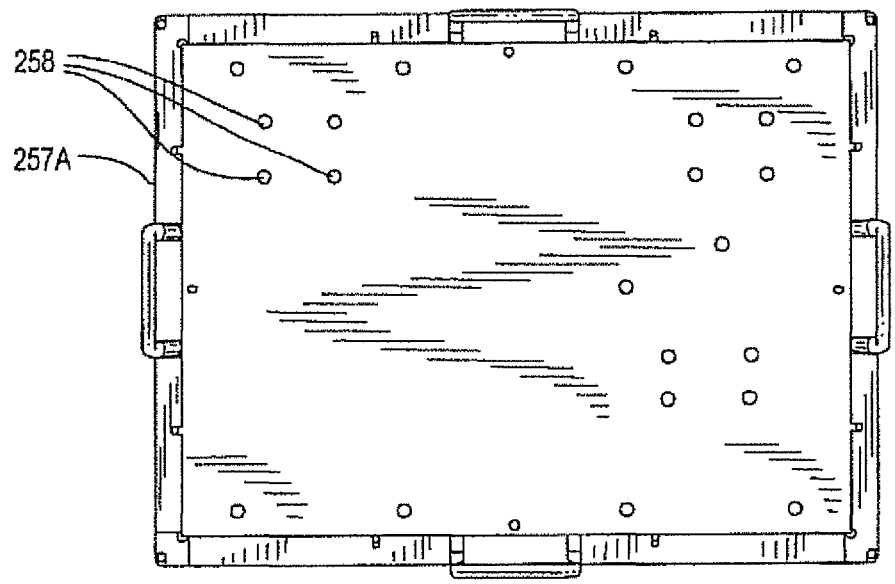
FIGS. 9E and 9F provide a top plan and a perspective view of a layup template like that shown in FIG. 5 but with four pivot handles and pins for releasing a bonded layup arrangement.
Figure 9F:
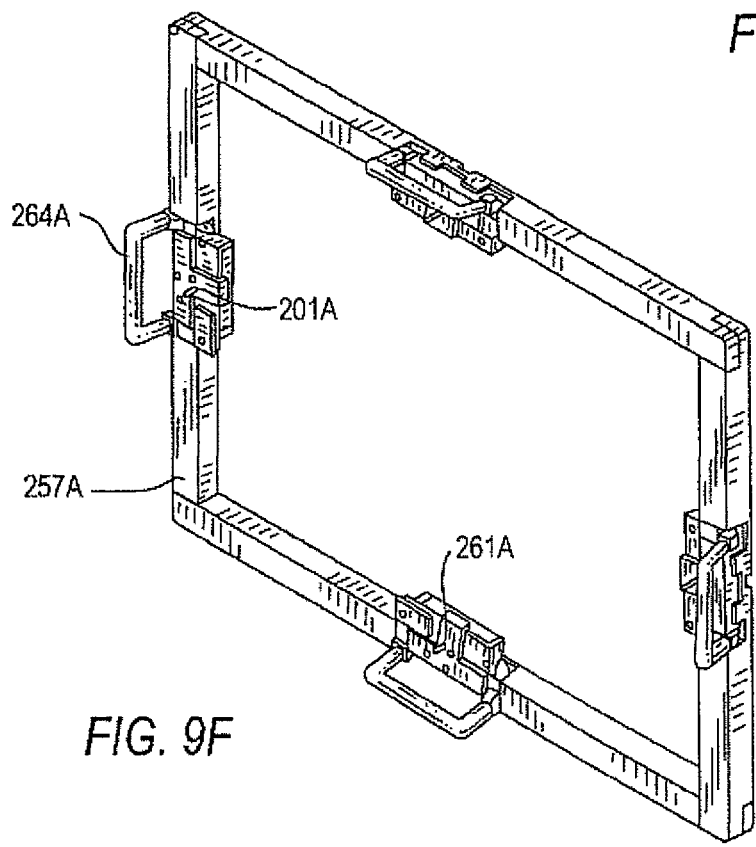
Figure 9H:
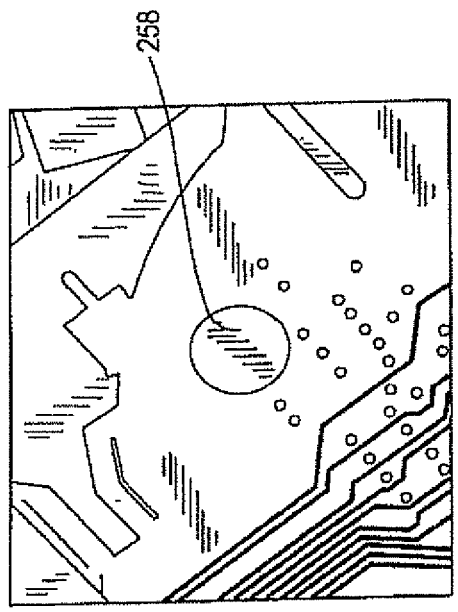
FIG. 9H is a close up image of a bond point before bonding by a bond head.

System 250A includes a support platform 251A supported by supports 252A and legs 253A, with an over support (shown as a gantry) for supporting respective bonding head members 254, 254, 254 (noting multiple top bonding heads and a single bottom bonding head). Here bonding heads may be induction bonding heads or thermal heads as discussed elsewhere herein. One bond head member 254 may be used as a dedicated tack head (shown as 254A proximate a dedicated tack template area 290A for quick user-tacking at need). Alternatively, multiple bonding heads 254 may be grouped together centrally for convenience (as is shown in FIGS. 9A-9C). Several optical alignment means 255 (here a laser pointer) are positioned on the top gantry proximate respective top bonding heads 254 (respectively) providing an offset laser alignment to denote respective multiple interior bond sites 258 for bonding action. A rigid layup template 257A is shown positioned on platform 251A and in a sliding X-Y relationship therewith (meaning template 257A with handles can be slid on surface 251A to align interior bond sites 258 with bonding heads 254 to bond interior positions without pins. During a use, an entire layup panel is positioned on and pined to lay up template 257A between respective handles (shown here as four 264A), and optically aligned with optical alignment means 255, positioning the same on respective bond sites 258 wherein respective opposed bond head members 254, 254 operate (hydraulically, pneumatically, manually), to contact the layup panel and bond the respective bond site. Multiple bond head members may be used on either top or bottom sides.

Lay up template 257A is noted with four handles, each having a respective pin 261A. As will be understood, as with FIG. 5, as each handle rotates, each respective pin 261A reclines into the template, removing the pin 261A from the layup securement (no longer held by the pin). In this way. A bottom bond template 263A having respectively a plurality of interior bond site openings 258 and respective outer pin openings 262A is layered with layup panel 260A and a top bond template 263A so as to be retained on layup template 257A aligned on pins 261A and held fixed by the construction of template 257A and slidably operable along platform 251A by respective handles. As noted a handle 267A is provided on either side of template 257A and is operable in a pivot motion (see arrow FIG. 7) to cause respective pins 261A to raise and lower relative to template 257A edges and thereby disengage layup panel 260A, and bond templates 263A for non-damaging removal from template 257A. In this manner, a manual pin alignment but optically bonded and guided system 300 can be easily provided.

During a use, respective ones of top and bottom bond heads 254, 254 are positioned co-axially on platform 251A and the gantry for coaxial motion (or individual tack use (using just a top tack-type bond head 254A (See FIG. 9C), here under pneumatic guidance along a motion axis to contact bond sites 258 designated by top and bottom bond templates 263A respectively. An optical aligning system 255, is noted here as a laser providing an guiding beam onto target 258 allowing a user to guide layup template 257A along platform 251A to position alignment laser beam on target 258 and to engage the respective operable instruments to bond each desired bond site.

As will be noted above, and included here again, various operational controls are provided on system 250A, these include dual on/off buttons (directly on the gantry), a master off (centered on top panel), a pressure gauge (for regulating the contact pressure of the bonding heads, in this case thermal cartridges having a bond pressure (in the 2 Bar or 20-30 psi range), a time counter controller (for bonding time regulation), a temperature controller for each bond head (there are two shown) and a manual control for power on/off on the far right. A pressure-air filter is noted, and a power supply cord is shown.

Figure 9G:
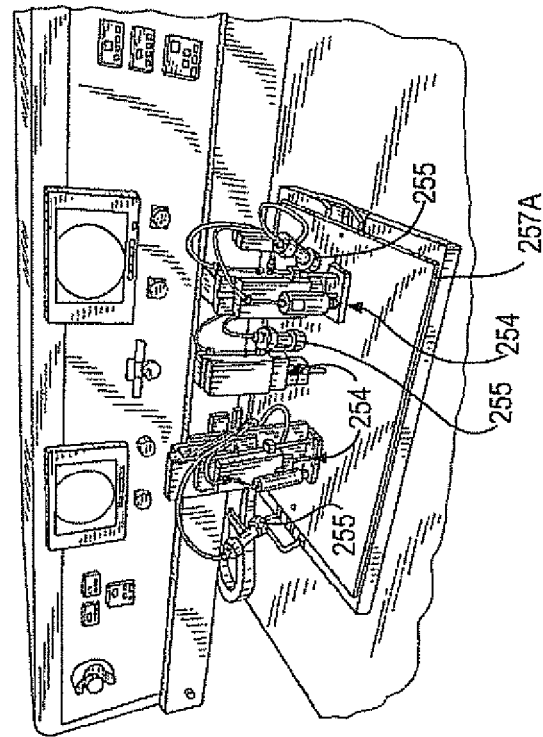
FIG. 9G provides a close up image of a top bond head as in FIG. 9A with multiple bond head and laser pointer and optical systems.
Figure 9I:
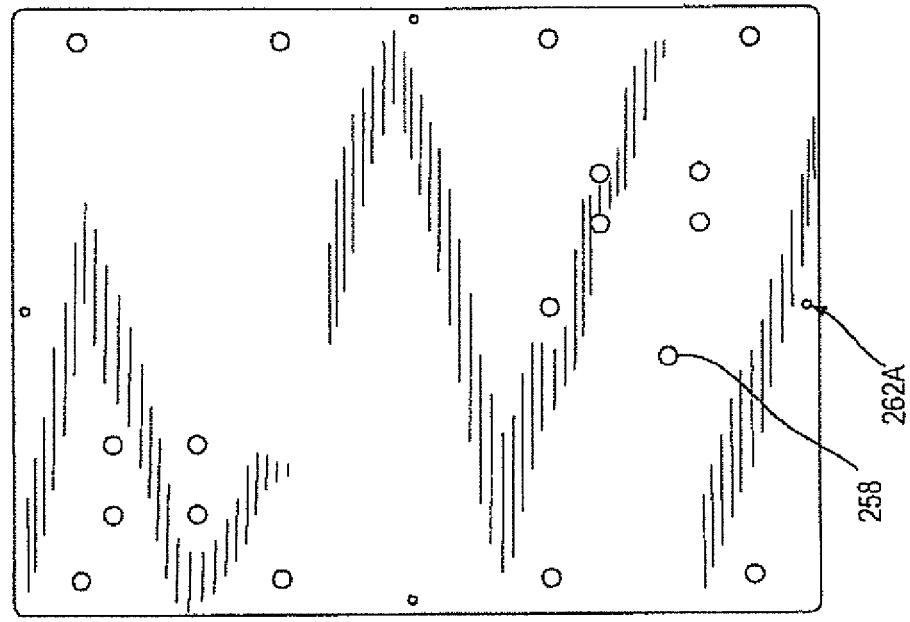
FIG. 9I is a plan image of a top and bottom template noting bonding clearance holes at internal bond locations and side alignment tooling holes.
Figure 9J:
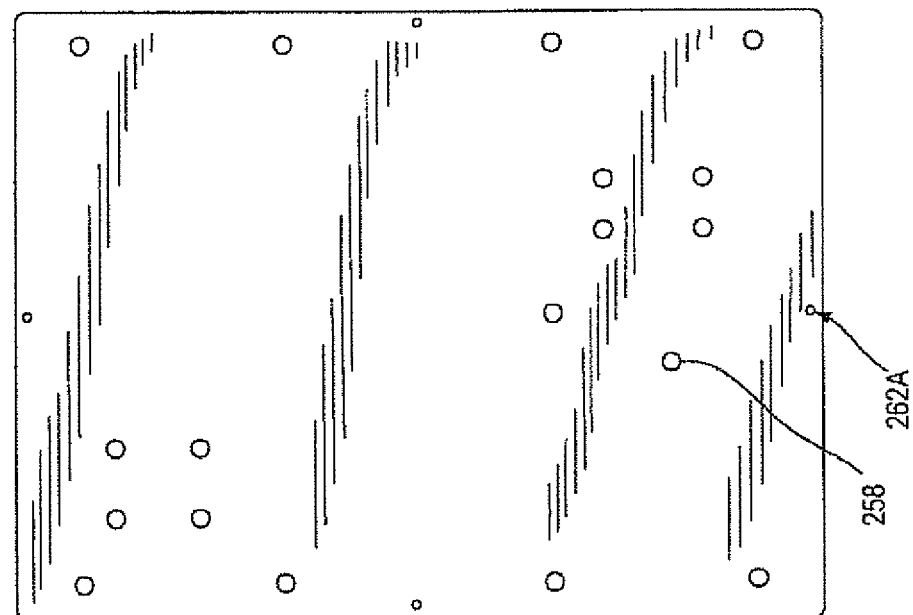
FIG. 9J is a plan image of a flex or rigid layer also noting copper clearance on top and bottom layers at internal bond location as well as the side alignment tooling holes for the pins.

Referring now to FIG. 9I respective top and bottom templates 263A are shown with clearance holes 258 located as needed for flex bonding portions and, shown here at a 0.50 inches diameter. FIG. 9J provides an exemplary flex or rigid layer arrangement (shown as rigid) where the clearance holes 258 allow portions of the flex or rigid line up to be bonded by 254 during a user arrangement.

Figure 10:
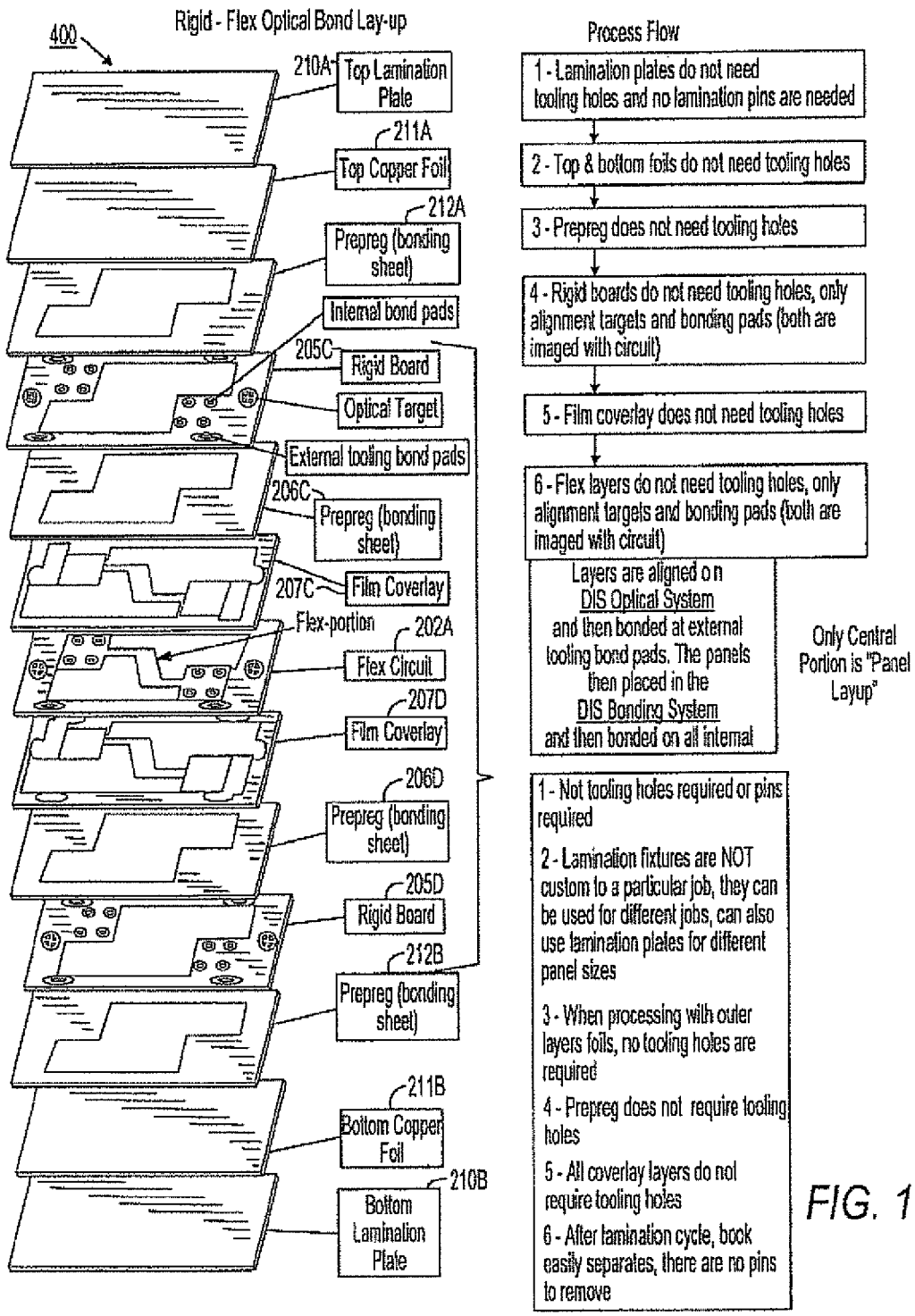
FIG. 10 is an illustrative schematic of a rigid-flex optical bond lay-up for use in an automatic alignment system and an automated bonding system.

Referring now to FIG. 10, a rigid-flexible board optical no-pin lay-up process 400 is discussed. As shown, no pins are used, either around the periphery or on an interior. Non-specialized (allowing alternative use) opposing top and bottom lamination plates 210A, 210B useful for common PCB and FSB constructions. There between are opposing top and bottom copper foil layers 211A, 211B, provided also being without punched holes. There between are also a prepreg bonding sheets 212A, 212B, also without punched holes, and thereafter, rigid boards 205C, 205D having no pin holes, but instead optical targets and internal bond pads, and film coverlays 207C, 207D also without pin holes. Interior of all of this is flexible circuit layer(s) 208. It will be understood that flex circuit layer 208 can include multiple flex circuit layers. All arranged as shown in FIG. 10. The phrases prepreg, flex, and coverlay will be understood by those of skill in the conventional arts.

As a result, a rigid-flex layup process 400 (without any pins), will at a minimum require the steps noted, including: (1) providing top and bottom lamination plates without pin locations, (2) providing top and bottom copper foil and prepreg layers without tooling holes, (3) no punching of top and bottom rigid boards, which are provided with internal bond pads and optical alignment targets, (4) similarly, the flex layer(s) nor other layers require punching or pins. In this manner, the entire assembly 400 will be understood as a partial panel lay-up but without any pining.

There are still further substantial benefits. Principally, the benefit that without any pin alignment requirement at all no tooling holes are required, there is no loss, and components can be easily spaced together, similarly there is no risk of damage while pins are removed post-bonding. Similarly, lamination fixtures (layup templates) are not required. They could be used, but are not required. After the lamination cycle, the entire book easily separates as there are no pins to remove at all which allows ready integration with Applicants optical alignment and automated process bonding system. The result is a still further substantial benefit in efficiency, cost reduction, and speed of operation.

Figure 11:
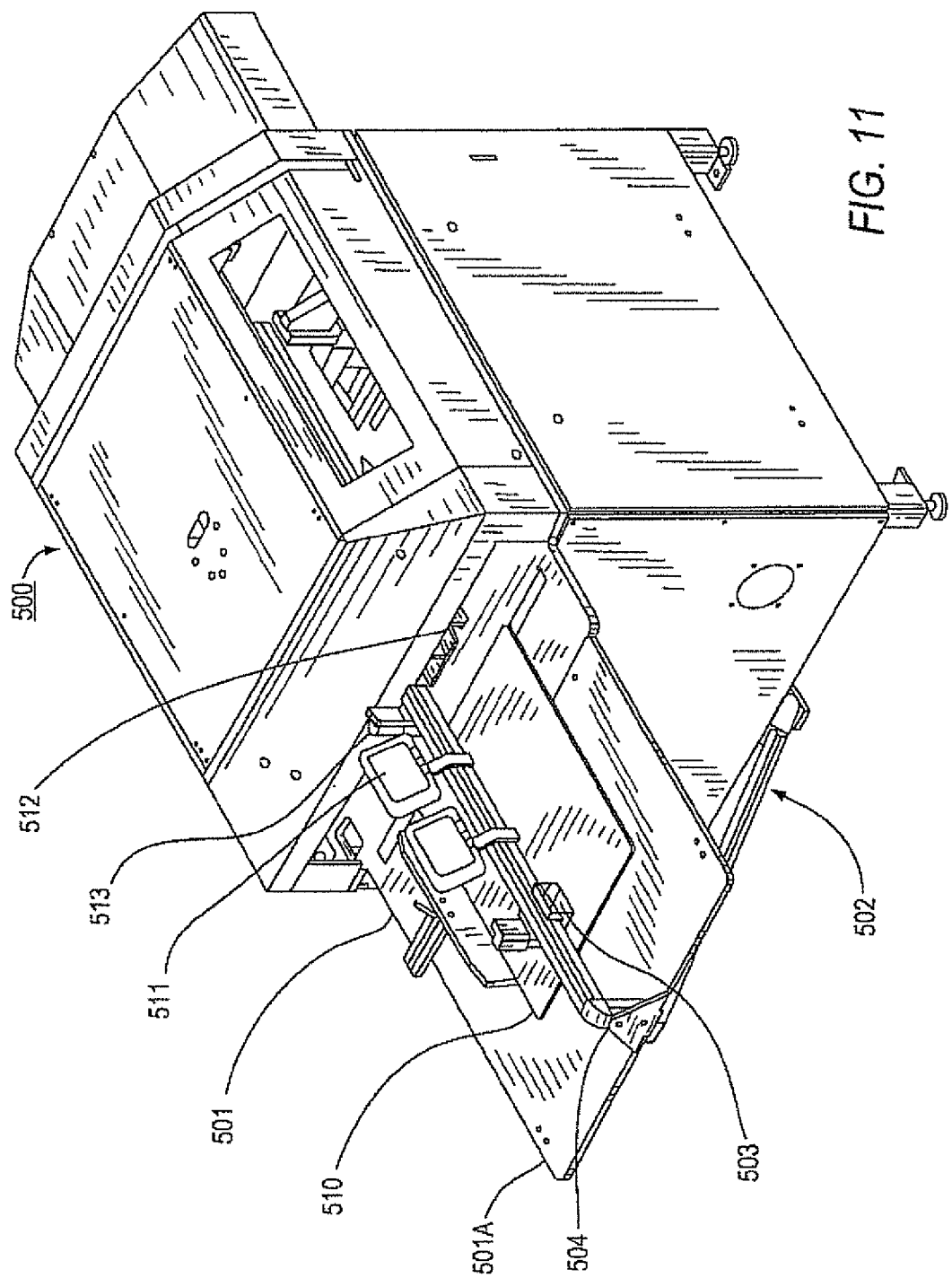
FIG. 11 is an exemplary automated optical alignment and bonding system noting an intake side, an operational location (interior) and an output side following alignment and bonding.

Referring now to FIG. 11, a pinless bonding system (PBS) is illustrated as an exemplary embodiment shown. Here, a PBS system 500 is a computer processor controlled system having a user input interface (not shown), using a machine-vision system, which locates visual targets, in conjunction with an X-Y-Y positioning table to manipulate each panel layer based upon identified optical targets (shown in FIG. 10) to a predefined location, where a system of clamps holds the layer in place (as will be discussed and as is illustrated by the incorporated-by-reference materials).

Generally, during operation (as will also be described in a sequence-of-operation below), each pane layup is loaded into the PBS machine, via a gripping loader system, where it is positioned and clamped and then bonded by computer controlled bonding heads operating on X-Y positioning systems. When suitably positioned, the panel layup is bonded at all the pre-loaded internal (and possibly external) bonding sites to create a flexible circuit board (FCB) by a set of welding heads. The heads spot-weld the panel layup targets, joining all layers together and forming a securely joined FCB.

When the welding process is complete, the gripping loader system (to be disclosed) is used to eject the completed FCB to an external unloading device for removal.

As constructed, the controlling computer system for the PBS performs various Statistical Process Control checks based upon optical targets to ensure that the panel lay up (multiple layups are possible) are within inputted allotted positional and material tolerances employing selected algorithms. In a preferred embodiment, the system makes use of a touch-screen monitor to provide the main user interface in a convenient manner. The system is controlled and configured via the touch-screen interface. When necessary, a virtual keypad is displayed on the screen, allowing for the entry of set points and configuration information, or the retrieval of previously stored (on a network server for example) data regarding a particular panel layup.

General System Description:

The PBS Pin-less Bonding System is comprised of the following major components:

Compatible computer or computer control system or systems such as a server-centralized system.

Runs a dedicated, custom control application, which provides the operational functionality and user interface described herein—including movement control and data management.

Touch-screen monitor (preferably operating as an input interface)

Provides a means of displaying a custom designed user interface, and allowing for easy operator interaction at a manufacturing location, including (optionally) a virtual keypad used to enter set points and configuration and other data.

Machine Vision Cameras (as discussed)

Provides images of the visual targets.

Vision Processing Algorithms housed within the compatible computer or computer systems.

These processing programs enable configurable, trainable algorithms that provide the method for locating the visual targets in the field of view of the cameras. The algorithms are configurable for multiple shape, size, and search acceptance criteria.

Motion System

Provides the means for mechanical and electrical material input and output from the machine.

Provides the means of operational panel layup manipulation inside the PBS machine, such that the layup is moved to a predefined and controllable position or manipulated to multiple positions for bonding as desired.

Provides configuration of the machine to the material based on the panel size input via the touch-screen interface.

Spot Welding/Bonding System

Provides the means of bonding the desired layers in the panel layup together for further processing outside of the PBS, for example a thermal bonding system or an induction bonding system may be employed as a spot welding system.

Machine I/O System

Provides the electromechanical (pneumatic, hydraulic, electronic, mechanical, sensor) means for controlling the grippers, clamps, platen, etc.

Includes both outputs to devices, and inputs from various sensors.

Generally, during "Machine Operation," once the system is powered up and the PBS software controller application initialized, the system is ready for operator interaction. In practice, the operator employs a "Job Setup" interface screen to describe the customer-defined job parameters (including, for example, which particular pane layup is being positioned, confirming the desired target locations for bonding, the "X" Panel Size (for example 18"×24"), Weld Head operation parameters, and whether SPC (statistical process control) or other analysis will be utilized).

Once the Setup information is complete, the operator initializes the PBS system 500 for operation. This is done via additional buttons on the User Interface. The system initializes all axes of motion, and moves the cameras to the designated X Panel Size. A Platen, Clamps and Gripper system are similarly configured for operation, and are not shown here but are incorporated by reference.

As will be discussed in detail, an operator places the pane lay up to be positioned and bonded on the loading station 501. A set of cameras and monitors in the operator loading station are used to facilitate pre-positioning with relation to the grippers and tooling inside the machine. When the operator is ready, a start button is actuated. The mechanical grippers grab the layup, and drag it into the machine 500, placing the layup at the proper computed position, based on the input X Panel Size, so that the bond targets are visible within the field of view of the multiple cameras inside the machine (not shown, but incorporated by reference).

Once inside, the platen system (not shown, but incorporated by reference) is engaged to grip the layup from above. A vacuum generator holds the layer, while a sub-platen is used to lift the layup. A multi-camera optical measurement system within PBS machine 500 analyzes the multiple targets from within the camera target fields of view, and computes any additional correcting manipulation moves (to achieve for example a best fit location for bonding). The X-Y-Y table is used to position the inner layer accordingly. The vision system is re-checked for positional accuracy. The sub-platen places the layup firmly in position and it is clamped for bonding. While the layer was being positioned, the loading grippers are returned to the load position, to be ready for the next layup task.

When all layers have been positioned and clamped, the weld heads are engaged, for a configurable time profile, to the secure layup together. Once complete, the loading grippers are used to eject the completed panel from the PBS system 500 and the process begins again.

During processing, the vision system is used to ensure that the visual targets are the right type, size, and orientation. Statistical Process Control computations are performed on each layer, relative to the first, to show relative expansion/contraction of each successive layer.

The pin-less bonding system 500 is provided with a pre-alignment or measurement station 501 extending external to an inner imagery and positioning system as will be discussed. Pre-alignment station 501 may also be referred to as an operator loading station, and includes supporting loading table 501A braced by loading table support 135 to provide a stable platform for receiving a typical layup 510 below a camera slide 503 supported by an end bracket 504, as shown.

Typical rigid flex layer 510 includes central reference bond targets (shown in FIG. 10 as earlier discussed) for viewing by two lateral CCD cameras 511, 511 positioned on camera slide 503 (and a computer input access screen not shown here, but a noted later at 520 may be used). A LCD pair of load monitors (not shown but joined with system 500 remotely provides visual feed-back to operators for pre-aligning typical layup 510 relative to respective targets. Following pre-alignment load gripper assemblies 512, 512 operate relative to a front work plate 513 for the PBS device 500 to grip layer 510 following initial operator alignment and data entry and retract (to the right in the views) it into the PBS machine in an aligned and re-set manner depending upon pre-alignment data readings via CCD cameras 511, 511.

It is procedurally envisioned, that operators employing PBS system 500 follow the following process:

1. Operator inserts inner layer 510 into the Pre-Alignment Station 501A.
2. Target are in the field of view of the Pre-Align CCD cameras 511, 511 as determined by inspecting images on screens (Shown in FIG. 11 as a touch screen element).
3. Operator(s) press one or more start buttons (not shown) after determining all functions are optimal, of the automating pinless bonding system (PBS) and loading and alignment apparatus.
4. The two loading grippers grab the layer and raise it for movement (approximately 20 cm).

5. The layer is now pulled into the PBS positioning system 400 and placed in the field of view of the main positioning cameras arrayed in a manner similarly discussed in the computer measurement system (CMS) or in another manner effective to achieve the benefits of the proposed invention.
6. The load grippers 512 return to the load position as the PBS begins the alignment.
7. Once positioned and alignment are confirmed the layup 510 is welded/bonded.
8. After the bond cycle, the second set of unload grippers grab (not shown) the bonded panel and send it out of the machine.
9. The process is repeated.

Figure 12:
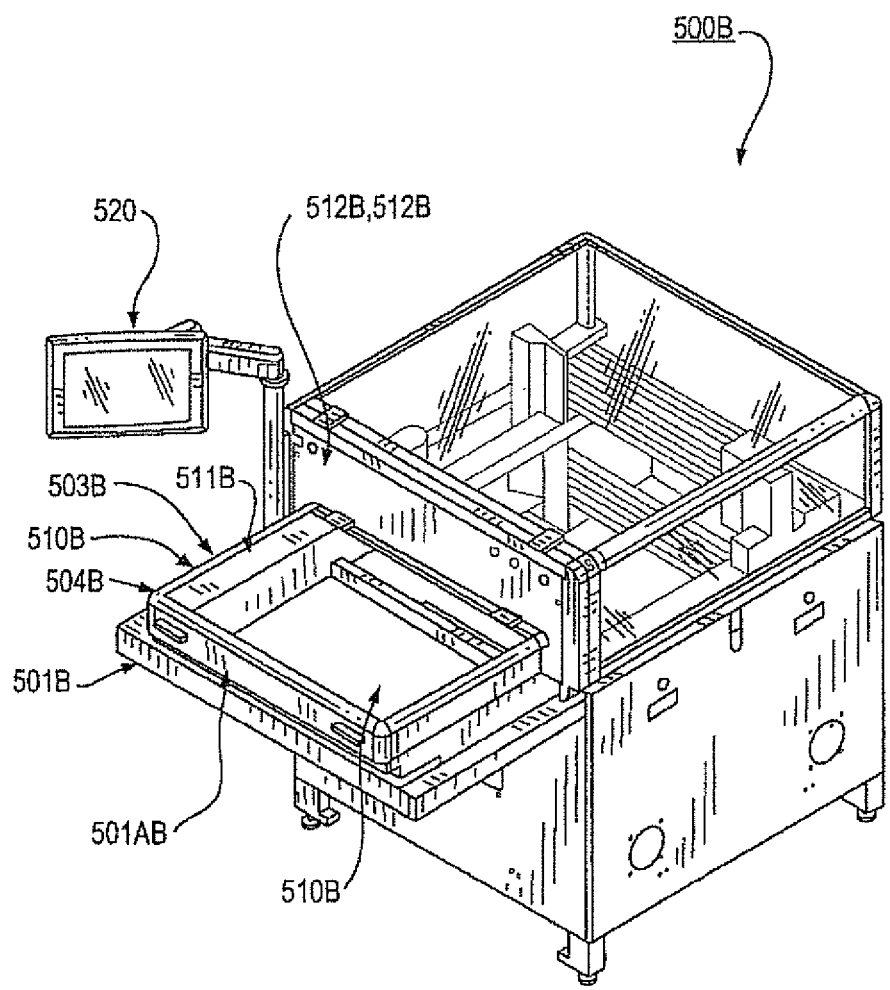
FIG. 12 is a further exemplary automated alignment and bonding system noting an intake side, an operational location (interior) and an output side following alignment and bonding as well as a touch screen input data entry (monitoring and keypad etc.) similar to FIG. 11.

Referring now to FIG. 12, where similar to FIG. 11, a pin-less bonding system 500B is provided with a pre-alignment or measurement station 501B extending external to an inner imagery and positioning system (under the shield shown) as will be discussed. Pre-alignment station 501B may also be referred to as an operator loading station, and includes supporting loading table 501AB to provide a stable platform for receiving a typical layup 510B (under the shield shown) below one or more camera slide 503B supported by bracket 504B, as shown.

A typical rigid flex layer 510B includes central reference bond targets (shown in FIG. 10 as earlier discussed) for viewing by two (or more) lateral CCD cameras 511B, 511B (internal to shield) positioned on camera slide 503B. A monitor 520 provides visual feed-back to operators for pre-aligning typical rigid flex layup 510B relative to respective targets. Following pre-alignment load gripper assemblies 512B, 512B operate relative to a front work plate 513B for the rigid flex PBS device 500B to grip layer 510B following initial operator alignment and data entry and retract (to the right in the views) it into the machine in an aligned and re-set manner depending upon pre-alignment data readings via CCD cameras 511B, 511B, and programming controls. Interior to machine 500B are shown support railings in an X-Y configuration for a top-and-bottom automated bond head positioning throughout the entire rigid-flex layup—thereby allowing an automated bonding of aligned rigid-flex layers at any location.

In further summary, the present invention relates to the following discussion: The goal of this invention is to be able to provide an improved process to connect together the layers of Rigid-Flex, Flexible and certain types of rigid Printed Circuit Boards (PCBs) (also known as Printed Wire Boards) to maintain alignment of the various layers prior to lamination.

Thus, the present invention relates to an improved system and method for manufacturing "rigid flex", flexible and rigid printed circuit boards by connecting the various layers of the circuit board together at non-restricted locations throughout a circuit board and layup to maintain layer to layer alignment prior to the circuit board entering the lamination press. These methods include the innovative connecting methods discussed herein and may be combined with those conventional methods ones already in use in the printed circuit industry (including heat bonding, heat bonding with a through hole, induction welding (heating of metal on the layer using an electromagnetic field), gluing, staking, fastening using rivets, fastening using eyelets, fastening using staples and connecting using skiving (a method where layers are cut and deflected to lock the layers into position)). Using these methods, the various layers and materials of the board can be connected together, by placing the heat bond site, weld site, gluing site or fastening location near the design feature on the interior portion of the printed circuit board. These connections could be used exclusively on the interior portion of the printed circuit board supplemented by connections on the outside boarder of the PCB.

It is additionally proposed as inventive to employ the proposed system in optional combination with a pin template (for example that shown in FIG. 5 or FIG. 9F), with a plurality of pin holes (262, 262A) for respective pins 261, 261A in each respective layer of the rigid or flex PCB to align the layers and materials of a rigid flex, flexible or rigid printed circuit board. The arrangement of printed circuit board layers on the pinned template are shown in FIGS. 6 and 7, or alternatively in FIG. 9D. The pinned layers can then be connected together using bonding by bonding members 254. The connections are made using a system similar to FIG. 3, 8, 9A, 11 or 12. After the various connections are made with a device similar to show in FIG. 9, the layers are then removed from the template for placement in the lamination press without the need for pins to maintain the alignment. The alignment will be maintained by the methods described herein.

It is further proposed as inventive to use the above methods along with a visual alignment method (no pins used with rigid layup templates). These visual alignment methods (See FIGS. 10-12) include using a camera and a screen to show the target image (see FIGS. 11, 12), aligning targets displayed by the camera image by sight or by aligning targets by sight with the aid of a visual magnifier as shown in FIG. 9G. An operator will manually manipulate each layer into position. The operator can then activate one of the bonding steps described to connect the layers of the circuit board together.

It is further proposed as inventive to use the above methods along with a machine vision system to identify a target image for alignment purposes. An operator will manually manipulate each layer into position and the vision system will give the operator an output indicator that the position aligned to the satisfaction of the vision system. The operator can then activate one of the methods described to connect the layers of the circuit board together.

It is further proposed as inventive to use a machine vision system to identify the target image and an automated mechanical means to manipulate each layer of a multilayer circuit board into position and then activate one of the methods described above to connect the layers of the circuit board together. This device is shown in FIGS. 11 and 12 (exemplary devices that use optical alignment mechanisms and mechanical positioning systems to grip-move-and-align within the device shown using techniques discussed as incorporated herein).

While non-limiting to the present disclosure, the following are proposed specifications for a potential PRS system.

Positioning System Repeatability: +/−17 micron-+/−0.7 mils. (Checked with dial indicator on positioned panel)
Panel sizes: Min 300×455 mm (16"×18"), Max 610×760 mm (24"×30")
Layup alignment speed: 7 seconds/layer average (dependent on target quality and operator pre-alignment speed)
Positioning system: X-Y-Y axis, cam driven, closed loop system thru CCD cameras
Bonding Type: Inductive (preferably)
Bonding panel thickness: Greater than CCD depth of field
Target size diameter (suggested): 0.75 mm-1.5 mm (0.030"-0.060")
Vision System
   Types of cameras: Synchronized Image CCD elements
   Depth of field: 8 mm (0.320") but not limited thereto
Illumination: UV LED ring lamps
Inner layer Copper type: No limitation
Pre-preg type: No limitation Thus, those of skill in the operational and system arts should recognize the following highlights of the proposed system operation.

The PBS system 500 uses the results of Vision Processing Algorithms to determine the current position of an inserted layup 510. That position is calculated, in relation to a pre-defined X-Y location within the machine, relative to the welding heads (not shown). The difference is computed in terms of X, Y1, and Y2 moves, and used as input for the motion and gripping systems (to be discussed).

The automated bond or weld-type heads (used in FIGS. 11-12) are configured to operate at individually set temperatures. The heads are active, but idle, until the proper time for welding. At that time, the heads are brought to the configured temperatures, and engaged to weld the layers together. At a configured time, the heads return to the idle state, and a series of air cooling jets are used to cool the heads and the spot welds, and the completed panel is ejected from the system.

In reviewing the above, those of skill in the art should recognize:

The vision system analyzes the target visuals from within the camera fields of view in manners known to those of skill in the imaging arts. Here, the system performs a grayscale search for a trained image. This search is tolerant of defects in the target and variations in lighting and contrast. The search returns results of score, scaling, rotation, and position (X, Y).

The results from each camera are validated based on a readily configurable limits (for score and scaling). The positions (X & Y) are then processed with the following computations:

The X & Y coordinates of each target are computed in relation to a set of X & Y configurable Reference Positions. The error is computed in X and Y.

The errors for each camera are related to moves that we can make using the X-Y-Y table. In this case, the X errors are averaged (since any X move moves the entire panel in X, any move made will affect both sides). The Y errors are handled independently, since the system can move the left and right sides independently.

A final set of X, Y1 and Y2 moves are computed, based on the configurable entries of camera Pixels Per Mil, and Motor Steps per Mil. In addition, a computation of this layer's spread (expansion or contraction) in relation to the first layer positioned is computed. If this is the first layer, the spread is (by definition) 0.

A decision is made as to whether the layer is within the configurable positioning tolerance (X, Y1, and Y2) or not. If the layer is not in position, it requires a move and raises a preferred decision operator flag. Note that the system will only make up to a configurable limit of moves before aborting the positioning procedure under the present programming.

The Sub Platen is raised, holding the top layer via a vacuum lock.

The X-Y-Y table is moved based on the corrective moves computed above.

The Sub-Platen is lowered, but still holds the layup via the vacuum lock.

The vision system again analyzes the target, and the process initiates bonding.

If the layer is out of tolerance, the operator is given the choice as to whether to reject this layer or to clamp anyway (no pins just clap securing). If this layer is rejected, it is manually removed from the machine, and the system is then ready for the next layer to be loaded.

The weld heads are engaged, and come up to the configured temperature profiles.

The weld heads are allowed to operate for a configurable time profile, to secure the layers together.

When the weld time is complete, the heads are deactivated. A set of air cooling jets is utilized to cool the material for a configurable time.

Once complete, the heads are disengaged, and the loading grippers are used to eject the completed panel from the system.

As noted above, the common "sequence of operation" regarding FIGS. 11-12, is as discussed in the following steps:

1. The operator places the first layup in the machines work area with the two (minimum) alignment targets in the field of view of the two cameras, and presses the start button.
2. The alignment/vacuum platform is lowered on top of the layer, this completely flattens the layer thus ensuring correct positional calculation of the center-to-center distance of the targets.
3. The unit aligns the layup to a preset zero position via machine vision technology and multiple axis movement. ("X", "Y1" "Y2" and "Z" axis).
4. Once in position, the layer is held in place by two sets of edge clamps and internal cameras visualize the desired bonding targets which are verified relative to a programmed location of an aligned layup.
5. The unit aligns the layup to a preset zero position via machine vision technology and multiple axis movement. ("X", "Y1" "Y2" and "Z" axis).
6. The steps are repeated for each layup and bonding cycle.
7. When the lay-up is completed, the bond cycle is activated and the layup is ejected.
8. The operator removes the bonded layup and begins the next lay-up, for example further processing.

Further, while the present discussion incorporates fully the entire detailed disclosures of the above identified references, and the alternative constructions noted herein, nothing herein shall prevent the systems, methods, and devices discussed herein from employing the alternative forms of optical alignment and manufacturing, as noted herein, without departing from the scope and spirit of the present inventions.

It will be further understood by those of skill in the art that the phrase panel lay-up represents one or a series of multi-layer layups reduced for visual/illustrative convenience into a single member. As a result, multiple layers will be understood to be enabled for interior bonding, as discussed herein.

It will be further understood by those of skill in the art, that as incorporated herein by reference from Applicant's own disclosure, that bonding locations may be variously supplied depending upon the type of bonding employed. For inductive bonding processes, bonding targets may be solid copper targets, a series of concentric shape targets (circular, rectangular, etc.), or where a heater cartridge/thermal bonder is provide, then no copper target is provided, and the bonding layers are thermally bonded in situ.

Additionally, while FSB's may normally extend from a thinner side region of a rigid circuit board, the present invention enables junction of a FSB mid-board, since a top bond template or a bottom bond template may have a region thereon to allow departure from the common plane of a portion of an FSB allowing creation of "T" type flex-arrangement (mid-field connection with a rigid circuit board and a FSB), without departing from the scope and spirit of the present invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A registration system for bonding a rigid-flex panel layup of a plurality laminate elements in a selected stack orientation, the system comprising:
    a first optical measurement system for receiving said layup, for imaging portions of said layup, and for determining a first reference orientation data set of said layup relative to a desired orientation of said layup;
    a computer operation control system for determining a required correction factor between said determined first reference orientation data set for said layup and said desired orientation of said layup;
    a pin-less alignment and positioning system for receiving said required correction factor positioning instructions from said computer operation control system and for positioning each said layup from a top position to said desired orientation during a bonding of said layup; and
    wherein said pin-less alignment and positioning system includes a pre-alignment loading station;
    a plurality of imagery cameras on said pre-alignment loading station, said plurality of imagery cameras enabling a pre-alignment of a layup; and
    a gripper assembly employs at least a vacuum plate system, a cam adjustment system movable relative to said vacuum plate system for adjustment, and a motion sensor system for gripping and positioning each said layup in said desired orientation, whereby said registration system enables an alignment and bonding operational use.

2. The registration system, according to claim 1, further comprising:
    a bonding system for bonding at least a first layup in said at said desired orientation.

3. The registration system, according to claim 1, wherein:
    said pin-less alignment and positioning means positions each said layup according to a four-axis orientation; and
    said layup having a plurality of interior bond site positions within a periphery of said layup.

4. The registration system, according to claim 3, wherein:
    said layup does not include bond site positions at said periphery, whereby said layup only includes said interior bond site positions.

* * * * *